US012575419B2

(12) United States Patent
Hung et al.

(10) Patent No.: US 12,575,419 B2
(45) Date of Patent: Mar. 10, 2026

(54) RADIO FREQUENCY DEVICE

(71) Applicant: UNITED MICROELECTRONICS CORP., Hsin-Chu City (TW)

(72) Inventors: Ching-Wen Hung, Tainan City (TW); Jinn-Horng Lai, Miaoli County (TW); Yan-Zung Wang, Tainan City (TW); Peng-Hsiu Chen, Tainan City (TW); Su-Ming Hsieh, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 399 days.

(21) Appl. No.: 18/116,812

(22) Filed: Mar. 2, 2023

(65) Prior Publication Data

US 2024/0243073 A1 Jul. 18, 2024

(30) Foreign Application Priority Data

Jan. 18, 2023 (TW) ................................. 112102188

(51) Int. Cl.
H01L 23/66 (2006.01)
H01L 23/522 (2006.01)
H01L 23/552 (2006.01)

(52) U.S. Cl.
CPC ........ H01L 23/552 (2013.01); H01L 23/5225 (2013.01); H01L 2223/66 (2013.01)

(58) Field of Classification Search
CPC ............... H01L 23/552; H01L 23/5225; H01L 2223/66; H01L 2223/6644; H01L 23/4824; H01L 23/66; H01L 23/5386; H10D 64/257
See application file for complete search history.

(56) References Cited

U.S. PATENT DOCUMENTS

| | | | |
|---|---|---|---|
| 7,005,708 B2 | 2/2006 | Mergens et al. | |
| 9,153,580 B2 * | 10/2015 | Mitomo ................. | H10D 84/83 |
| 10,008,490 B2 * | 6/2018 | Salcedo ................. | H10D 89/10 |
| 10,756,027 B1 | 8/2020 | Zhou | |
| 2002/0038894 A1 * | 4/2002 | Haematsu ........... | H01L 23/4821 257/E29.317 |
| 2010/0219476 A1 * | 9/2010 | Lee ...................... | H10D 89/811 257/E23.001 |
| 2012/0326235 A1 * | 12/2012 | Otsuru ................... | H10D 89/10 257/355 |
| 2015/0243657 A1 * | 8/2015 | Lin .................... | H01L 23/49562 257/401 |
| 2015/0303300 A1 * | 10/2015 | Schillaci .............. | H10D 62/106 257/329 |
| 2021/0126096 A1 * | 4/2021 | Cwiklinski ............. | H03F 3/211 |
| 2021/0193569 A1 | 6/2021 | Shilimkar | |

(Continued)

*Primary Examiner* — Dale E Page
*Assistant Examiner* — Christian A Tivarus
(74) *Attorney, Agent, or Firm* — Winston Hsu

(57) ABSTRACT

A radio-frequency (RF) device includes a main device on a substrate, a first port extending along a first direction adjacent to a first side of the main device, a second port extending along the first direction adjacent to a second side of the main device, a first shield structure adjacent to a third side of the main device, a second shield structure adjacent to a fourth side of the main device, a first connecting structure extending along a second direction to connect the first port and the main device, and a second connecting structure extending along the second direction to connect the second port and the main device.

16 Claims, 2 Drawing Sheets

(56)          References Cited

U.S. PATENT DOCUMENTS

2022/0139809 A1*   5/2022   Mousavian .......... H10D 30/475
                                                              257/76
2022/0415831 A1*  12/2022   Verma ................. H01L 25/0652

* cited by examiner

RADIO FREQUENCY DEVICE

BACKGROUND OF THE INVENTION

1. Field of the Invention

The invention relates to a semiconductor device, and more particularly to a radio-frequency (RF) device.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

Nevertheless in conventional fabrication of RF devices, the relationship between gain and frequency measured after the fabrication process is often affected by the fabrication parameters to produce abnormal values that further induce noise in the substrate. Hence, how to improve current RF device structures for resolving this issue has become an important task in this field.

SUMMARY OF THE INVENTION

According to an embodiment of the present invention, a radio-frequency (RF) device includes a main device on a substrate, a first port extending along a first direction adjacent to a first side of the main device, a second port extending along the first direction adjacent to a second side of the main device, a first shield structure adjacent to a third side of the main device, a second shield structure adjacent to a fourth side of the main device, a first connecting structure extending along a second direction to connect the first port and the main device, and a second connecting structure extending along the second direction to connect the second port and the main device.

According to another aspect of the present invention, a radio-frequency (RF) device includes a main device on a substrate, a first port extending along a first direction adjacent to a first side of the main device, a second port extending along the first direction adjacent to a second side of the main device, a first bar pattern between the first port and the main device, and a second bar pattern between the second port and the main device. Preferably, a difference between a length of the first bar pattern and a length of the main device is less than 30%.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
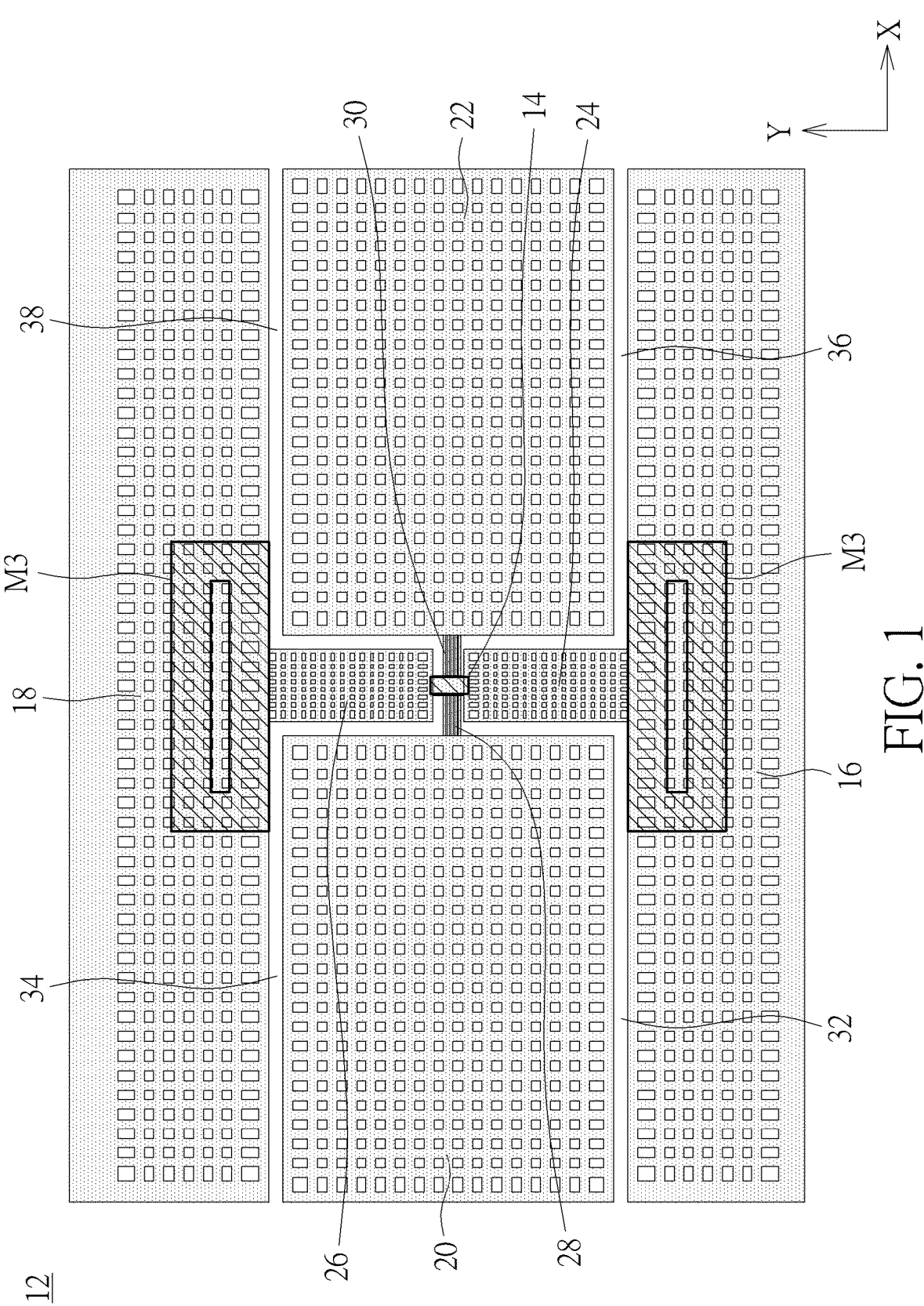
FIG. 1 illustrates a top view of a RF device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 2:
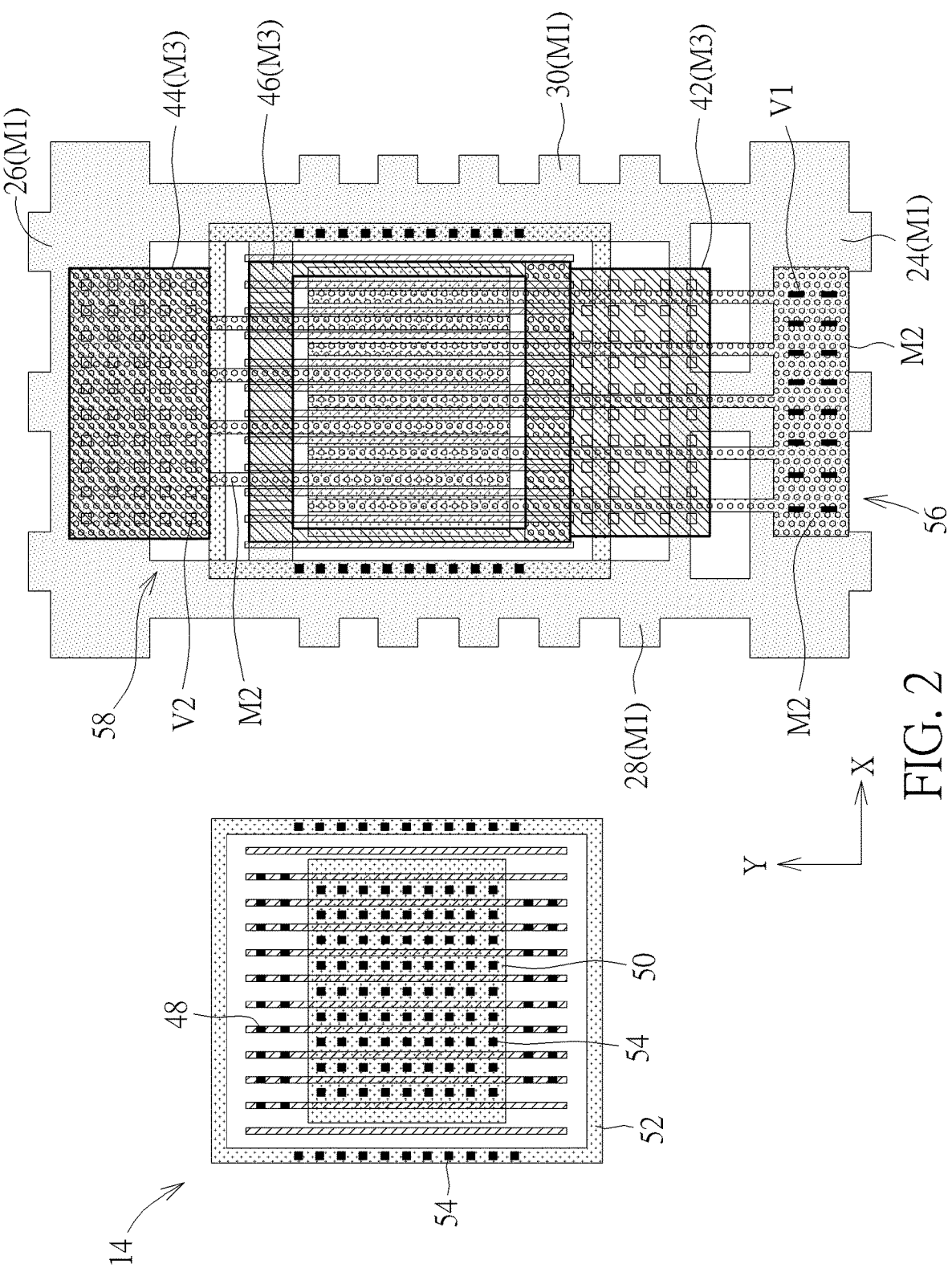
FIG. 2 illustrates an enlarged view of the main device within the RF device of FIG. 1.

Referring to FIGS. 1-2, FIG. 1 illustrates a top view of a RF device according to an embodiment of the present invention and FIG. 2 illustrates an enlarged view of the main device within the RF device of FIG. 1. As shown in FIG. 1, the RF device includes a main device 14 disposed on a substrate 12, a first port 16 extending along a first direction such as X-direction adjacent to a first side such as bottom side of the main device, a second port 18 extending along the same X-direction adjacent to a second side such as top side of the main device 14, a first shield structure 20 adjacent to a third side such as left side of the main device 14, and a second shield structure 22 adjacent to a fourth side such as right side of the main device 14.

It should be noted that the main device 14 is preferably disposed on the center or relatively center location of the RF device or substrate 12, in which the definition of the center of the RF device could be interpreted as a distance measured from the center or central point of the main device 14 to the bottom edge of first port 16 is equal to the distance measured from the center of the main device 14 to the top edge of the second port 18 while the distance measured from the center of the main device 14 to left edge of the first shield structure 20 is equal to the distance measured from the center of the main device 14 to the right edge of the second shield structure 22.

If the main device 14 is positioned on the relative center of the entire device or the substrate 12, the distance measured from the center or central point of the main device 14 to the bottom edge of the first port 16 is within 90% to 110% of the distance measured from the center of the main device 14 to the top edge of the second port 18, or the distance measured from the center of the main device 14 to the top edge of the second port 18 is within 90% to 110% of the distance measured from the center of the main device 14 to the bottom edge of the first port 16. At the same time, the distance measured from the center of the main device 14 to the left edge of the first shield structure 20 is within 90% to 110% of the distance measured from the center of the main device 14 to the right edge of the second shield structure 22 or the distance measured from the center of the main device 14 to the right edge of the second shield structure 22 is within 90% to 110% of the distance measured from the center of the main device 14 to the left edge of the first shield structure 20, which are all within the scope of the present invention.

The RF device also includes a first connecting structure 24 extending along a second direction such as Y-direction to connect the first port 16 and the main device 14, a second connecting structure 26 extending along the same Y-direction to connect the second port 18 and the main device 14, a third connecting structure 28 extending along X-direction to connect the first shield structure 20 and the main device 14, and a fourth connecting structure 30 extending along X-direction to connect the second shield structure 22 and the main deice 14.

Specifically, the first shield structure 20 is disposed between the first port 16 and the second port 18, the second shield structure 22 is disposed between the first port 16 and the second port 18, a gap 32 or spacing is disposed between the first port 16, the first shield structure 20, and the first connecting structure 24, a gap 34 is disposed between the second port 18, the first shield structure 20, and the second connecting structure 26, a gap 36 is disposed between the first port 16, the second shield structure 22, and the first connecting structure 24, and a gap 38 is disposed between the second port 18, the second shield structure 22, and the second connecting structure 26, in which each of the gaps 32, 34, 36, 38 includes a L-shape if viewed from a top view perspective.

In this embodiment, the substrate 12 preferably includes a substrate 12 made of semiconductor material, in which the substrate 12 could be selected from the group consisting of silicon (Si), germanium (Ge), Si-Ge compounds, silicon carbide (SiC), and gallium arsenide (GaAs). The main device 14 includes a RF transistor, the first port 16 is connected to a source end of the main device 14, the second port 18 is connected to a drain end of the main device 14, and all of the first port 16, the second port 18, the first shield structure 20, the second shield structure 22, the first connecting structure 24, the second connecting structure 26, the third connecting structure 28, and the fourth connecting structure 30 are all made of metal interconnections, in which the metal interconnections constituting the first port 16, the second port 18, the first shield structure 20, the second shield structure 22, the first connecting structure 24, the second connecting structure 26, the third connecting structure 28, and the fourth connecting structure 30 are disposed on the same level.

Referring to FIGS. 1-2 at the same time, FIG. 2 illustrates an enlarged view of the main device 14 from the RF device as shown in FIG. 1, in which the left portion of FIG. 2 illustrates a top view of the main device 14 while the right portion of FIG. 2 illustrates an overview perspective of the main device 14 and surrounding elements. As shown in FIG. 2, the RF device preferably includes a main device 14 disposed on the substrate 12, a first connecting structure 24 disposed under the main device 14 and connecting the first port 16 and the main device 14, a second connecting structure 26 disposed on top of the main device 14 and connecting the second port 18 and the main device 14, a third connecting structure 28 disposed on the left side of the main device 14 and connecting the first shield structure 20 and the main device 14, a fourth connecting structure 30 disposed on the right side of the main device 14 and connecting the second shield structure 22 and the main device 14, a first bar pattern 42 disposed between the first connecting structure 24 and the main device 14, a second bar pattern 44 disposed between the second connecting structure 26 and the main device 14, and a ring-shape metal pattern 46 surrounding part of the main device 14.

The main device 14 further includes a plurality of gate patterns 48 extending along the second direction such as Y-direction on the substrate 12, a first diffusion region 50 extending along X-direction between the gate patterns 48, a second diffusion region 52 surrounding the gate patterns 48, and a plurality of contact plugs 54 disposed on the first diffusion region 50 and the second diffusion region 52. Preferably, the first diffusion region 50 could include source/ drain regions of the main device 14, the second diffusion region 52 could be serving as a seal ring, each of the gate patterns 48 could include polysilicon gate patterns or metal gate patterns, and the first diffusion region 50 and the second diffusion region 52 are disposed in the substrate 12 adjacent to two sides of the gate patterns 48 while sharing dopants of same type such as n-type or p-type dopants.

In this embodiment, the first bar pattern 42 and the main device 14 preferably have substantially same length or a difference between the length of the first bar pattern 42 and the length of the main device 14 is less than 30%. Preferably, the length of the first bar pattern 42 could be defined as the length of the first bar pattern 42 extending along X-direction while the length of the main device 14 could be defined as the length of the first diffusion region 50 extending along X-direction. In other word, the length of the first bar pattern 42 extending along X-direction is substantially equal to, slightly less than, or slightly greater than the length of the first diffusion region 50 extending along X-direction.

According to an embodiment of the present invention, a difference between the length of the first bar pattern 42 extending along X-direction and the length of the first diffusion region 50 extending along X-direction is preferably less than 30%, 20%, 10% or most preferably 0. For instance, the difference between the length of first bar pattern 42 extending along X-direction and the length of first diffusion region 50 extending along X-direction could be less than 30%, 20%, or 10% of the length of the first bar pattern 42 itself extending along X-direction, or the difference between the length of first bar pattern 42 extending along X-direction and the length of first diffusion region 50 extending along X-direction could be less than 30%, 20% or 10% of the length of the first diffusion region 50 itself extending along X-direction. According to yet another embodiment of the present invention, the length of the first bar pattern 42 extending along X-direction could be between 70% to 130%, 80% to 120%, or 90% to 110% of the length of the first diffusion region 50 extending along X-direction, or the length of the first diffusion region 50 extending along X-direction could be between 70% to 130%, 80% to 120%, or 90% to 110% of the length of the first bar pattern 42, which are all within the scope of the present invention.

According to an embodiment of the present invention, the length of the first bar pattern 42 extending along X-direction is preferably between 1.2 to 1.5 microns or most preferably at 1.35 microns, the length of the first bar pattern 42 extending along Y-direction on the other hand is between 0.6 to 0.8 microns or most preferably at around 0.7 microns. In other word, the length of the first diffusion region 50 extending along X-direction is also preferably between 1.2 to 1.5 microns or most preferably at 1.35 microns.

Similar to the first bar pattern 42, the second bar pattern 44 and the main device 14 preferably have substantially same length or a difference between the length of the second bar pattern 44 and the length of the main device 14 is less than 30%. Preferably, the length of the second bar pattern 44 could be defined as the length of the second bar pattern 44 extending along X-direction while the length of the main device 14 could be defined as the length of the first diffusion region 50 extending along X-direction. In other word, the length of the second bar pattern 44 extending along X-direction is substantially equal to, slightly less than, or slightly greater than the length of the first diffusion region 50 extending along X-direction.

According to an embodiment of the present invention, a difference between the length of the second bar pattern 44 extending along X-direction and the length of the first diffusion region 50 extending along X-direction is preferably less than 30%, 20%, 10% or most preferably 0. For instance, the difference between the length of second bar pattern 44 extending along X-direction and the length of first diffusion region 50 extending along X-direction could be less than 30%, 20%, or 10% of the length of the second bar pattern 44 itself extending along X-direction, or the difference between the length of second bar pattern 44 extending along X-direction and the length of first diffusion region 50 extending along X-direction could be less than 30%, 20% or 10% of the length of the first diffusion region 50 itself extending along X-direction. According to yet another embodiment of the present invention, the length of the second bar pattern 44 extending along X-direction could be between 70% to 130%, 80% to 120%, or 90% to 110% of the length of the first diffusion region 50 extending along X-direction, or the length of the first diffusion region 50 extending along X-direction could be between 70% to 130%, 80% to 120%, or 90% to 110% of the length of the second bar pattern 44, which are all within the scope of the present invention.

Since the second bar pattern 44 and the main device 14 preferably have substantially same length, the first bar pattern 42 and the second bar pattern 44 also have substantially same length and the difference between lengths of the first bar pattern 42 and the second bar pattern 44 is preferably less than 10%. It should be noted that even though the lengths of the first bar pattern 42 and the second bar pattern 44 extending along X-direction are substantially equal to the length of the first diffusion region 50 of the main device 14 extending along X-direction, the left and right sidewalls of the first bar pattern 42 and second bar pattern 44 extending along Y-direction could be aligned with or not aligned with left and right sidewalls of the first diffusion region 50 extending along Y-direction.

If viewed from a top down or stacking perspective, the first port 16, the second port 18, the first connecting structure 24, the second connecting structure 26, the third connecting structure 28, the fourth connecting structure 30, the first bar pattern 42, the second bar pattern 44, and the metal pattern 46 are all made of metal interconnections including copper (Cu). Preferably, the first connecting structure 24, the second connecting structure 26, the third connecting structure 28, and the fourth connecting structure 30 surrounding the main device 14 are first level metal interconnections M1 disposed directly on top and directly contacting the contact plugs 54, the first metal interconnections M1 are connected to the second level metal interconnections M2 above through first level contact vias V1 while the second level metal interconnections M2 connect to a source end 56 and a drain end 58 of the main device 14, and the second level metal interconnections M2 are connected to the third level metal interconnections M3 above including the metal pattern 46, the first bar pattern 42, and the second bar pattern 44 through second level contact vias V2.

Viewing from a top view perspective, the second level metal interconnections M2 under the main device 14 preferably serves as the source end 56 connecting the first diffusion region 50, the second level metal interconnections M2 above the main device 14 serves as the drain end 58 connecting the first diffusion region 50, and the first metal pattern 46, the first bar pattern 42, and the second bar pattern 44 are all disposed on the same level serving as third level metal interconnections M3. Preferably, the metal pattern 46 is connected to the gate patterns 48 of the main device 14 and connecting and contacting the first bar pattern 42 directly but not contacting any of the second bar pattern 44.

Specifically, the metal pattern 46 overlaps the gate patterns 48 and the first diffusion region 50 while surrounding the first diffusion region 50, a gap is disposed between the metal pattern 46 and the second diffusion region 52 so that the two elements 46, 52 not contacting each other directly, and the length of the metal pattern 46 extending along X-direction is slightly greater than the length of the first diffusion region 50 extending along X-direction and the length of the first bar pattern 42 extending along X-direction.

Typically, after RF devices are fabricated, the relationship between gain and frequency measured after the fabrication process is often affected by fabrication parameters to produce abnormal values. To resolve this issue the present invention places the main RF transistor of the main device on the center position of the entire device or the substrate and then selectively adjusts the lengths of two bar patterns immediately adjacent to the main device. As disclosed in the aforementioned embodiment, the lengths of the two bar patterns such as the first bar pattern 42 and the second bar pattern 44 could be adjusted to be substantially equal to the length of the diffusion region in the main device.

Moreover, it would also be desirable to dispose additional metal patterns such as the first shield structure 20, the second shield structure 22, the first connecting structure 24, the second connecting structure 26, the third connecting structure 28, and the fourth connecting structure 30 adjacent to two sides or even four sides of the main device for increasing overall coverage area of metal patterns. According to a preferred embodiment of the present invention, by increasing overall coverage area of metal patterns of the device to 50% or even 80% and above, issue such as substrate noise could be improved effectively and dishing effect caused during chemical mechanical polishing (CMP) process could also be minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio-frequency (RF) device, comprising:
a main device comprising a transistor on a substrate;
a first port extending along a first direction, adjacent to a first side of the main device, and connected to a source end of the main device;
a second port extending along the first direction, adjacent to a second side of the main device, and connected to a drain end of the main device;
a first shield structure adjacent to a third side of the main device;
a second shield structure adjacent to a fourth side of the main device;
a third connecting structure extending along the first direction to connect the first shield structure and the main device; and
a fourth connecting structure extending along the first direction to connect the second shield structure and the main device.

2. The RF device of claim 1, wherein the first shield structure is between the first port and the second port.

3. The RF device of claim 1, wherein the second shield structure is between the first port and the second port.

4. The RF device of claim 1, further comprising:
a first connecting structure extending along a second direction to connect the first port and the main device; and
a second connecting structure extending along the second direction to connect the second port and the main device.

5. The RF device of claim 4, wherein the first port and the first connecting structure are on a same metal level.

6. The RF device of claim 4, wherein the second port and the second connecting structure are on a same metal level.

7. The RF device of claim 1, wherein the first port and the third connecting structure are on a same metal level.

8. The RF device of claim 1, wherein the second port and the fourth connecting structure are on a same metal level.

9. The RF device of claim 1, wherein the main device is on a center of the substrate.

10. A radio-frequency (RF) device, comprising:
a main device comprising a transistor on a substrate;
a first port extending along a first direction, adjacent to a first side of the main device, and connected to a source end of the main device;
a second port extending along the first direction, adjacent to a second side of the main device, and connected to a drain end of the main device;
a first bar pattern between the first port and the main device, wherein a difference between a length of the first bar pattern and a length of the main device is less than 30% of a length of the bar pattern;
a second bar pattern between the second port and the main device;
gate patterns extending along a second direction on the substrate;
a first diffusion region adjacent to the gate patterns, extending along the first direction between the gate patterns; and
a second diffusion region around the gate patterns; and
a metal pattern overlapping the gate patterns and the first diffusion region, wherein the metal pattern comprises a ring-shape.

11. The RF device of claim 10, wherein the length of the first bar pattern is less than a length of the first diffusion region.

12. The RF device of claim 10, wherein the length of the first bar pattern is greater than a length of the first diffusion region.

13. The RF device of claim 10, wherein the length of the first bar pattern is less than a length of the second diffusion region.

14. The RF device of claim 10, wherein the metal pattern surrounds the first diffusion region.

15. The RF device of claim 10, wherein the first bar pattern connects the metal pattern directly.

16. The RF device of claim 10, wherein the first bar pattern and the metal pattern are on a same metal level.

* * * * *